(12) United States Patent
Nilssen

(10) Patent No.: US 6,472,827 B1
(45) Date of Patent: *Oct. 29, 2002

(54) PARALLEL-RESONANT INVERTER-TYPE FLUORESCENT LAMP BALLAST

(76) Inventor: Ole K. Nilssen, 602 Caesar Dr., Rte. 5, Barrington, IL (US) 60010

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/032,569
(22) Filed: Mar. 18, 1993

Related U.S. Application Data

(63) Continuation of application No. 07/719,671, filed on Jun. 24, 1991, now abandoned, which is a continuation of application No. 07/346,292, filed on May 1, 1989, now abandoned, which is a continuation of application No. 06/697,949, filed on Feb. 4, 1985, now abandoned, which is a continuation-in-part of application No. 06/658,423, filed on Oct. 5, 1984, now abandoned.

(51) Int. Cl.[7] .............................................. H05B 37/01
(52) U.S. Cl. .................. 315/209 R; 315/219; 315/222; 315/224; 315/279; 315/307; 315/DIG. 7; 363/19; 363/23; 363/133; 323/249; 323/302
(58) Field of Search .............................. 315/209 R, 219, 315/222, 224, 279, 307, DIG. 7; 363/19, 23, 133; 323/249, 302

(56) References Cited

U.S. PATENT DOCUMENTS

| | | | | |
|---|---|---|---|---|
| 4,277,726 A | * | 7/1981 | Burke | 315/224 X |
| 4,484,108 A | * | 11/1984 | Stupp et al. | 315/219 |
| 4,513,364 A | * | 4/1985 | Nilssen | 315/219 |
| 4,563,616 A | * | 1/1986 | Stevens | 315/219 X |

FOREIGN PATENT DOCUMENTS

EP 0126556 A * 11/1984 .................. 315/219

* cited by examiner

Primary Examiner—Michael B Shingleton

(57) ABSTRACT

A push-pull inverter is supplied from an inductively current-limited DC voltage source by way of a center-tap on a transformer having significant inductance. This transformer inductance is parallel-coupled with a capacitance means. The inverter is made to self-oscillate through positive feedback provided by way of a saturable current transformer. The inverter frequency is determined by the saturation time of this current transformer, which saturation time is designed to be somewhat longer than the half-cycle period of the natural resonance frequency of the transformer inductance combined with the capacitance means. By controlling the length of this saturation time, the magnitude of the current provided to the fluorescent lamp is controlled, thereby permitting control of the light output in response to changes in the magnitude of the power line voltage.

26 Claims, 1 Drawing Sheet

PARALLEL-RESONANT INVERTER-TYPE FLUORESCENT LAMP BALLAST

RELATED APPLICATIONS

The present application is a continuation of application Ser. No. 07/719,671 filed Jun. 24, 1991, now abandoned which is a continuation of application Ser. No. 07/346,292 filed May 1, 1989 now abandoned, which a continuation of application Ser. No. 06/697,949 filed Feb. 2, 1985, now abandoned; which was a Continuation-in-Part of Ser. No. 06/658,423 filed Oct. 4, 1984 now abandoned.

BACKGROUND OF THE INVENTION

1. Field of Invention

The present invention relates to power-line-operated inverter-type fluorescent lamp ballasts, particularly of the kind using a current-excited parallel-loaded resonant L-C circuit for matching the inverter output to the lamp load.

2. Prior Art

Power-line-operated inverter-type fluorescent lamp ballasts using a current-excited parallel-loaded resonant (or near resonant) L-C circuit for matching the inverter output to the lamp load are well known and widely used. An example of such a ballast is described in U.S. Pat. No. 4,277,726 to Burke.

One significant problem generally associated with these ballasts relates to their relatively poor ability to regulate lamp light output in response to variations in the magnitude of the power line voltage.

SUMMARY OF THE INVENTION

Objects of the Invention

An object of the present invention is that of providing cost-effective means for controlling and/or regulating the light output associated with inverter-type fluorescent lamp ballasts.

This as well as other important objects and advantages of the present invention will become apparent from the following description.

Brief Description

A push-pull inverter is supplied from an inductively current-limited DC voltage source by way of a center-tap on a transformer having significant inductance. This transformer inductance is parallel-coupled to a capacitance means. A fluorescent lamp is series-connected with a current-limiting inductor, and this lamp-inductor series-combination is connected in parallel with the capacitance means.

The inverter is made to self-oscillate through positive feedback provided by way of a saturable current transformer. The inverter frequency is determined by the saturation time of this current transformer, which saturation time is designed to be somewhat longer than the half-cycle period of the natural resonance frequency of the transformer inductance means combined with the parallel-coupled capacitance means as well as the parallel-coupled lamp-inductor series-combination.

The saturable current transformer comprises a ferrite magnetic core, and the length of the saturation time of this transformer is determined by the magnitude of the magnetic saturation flux of this ferrite core.

The magnitude of the magnetic saturation flux is determined by the temperature of the ferrite magnetic core: the higher the temperature, the lower the magnitude of the magnetic saturation flux. By heating the ferrite core as a function of the magnitude of the DC voltage supplying power to the inverter, the inverter frequency is made to vary in inverse relationship with the magnitude of this DC voltage. As an overall result, lamp light output is kept substantially constant in spite of substantial variations in the magnitude of the DC supply voltage.

DESCRIPTION OF THE PREFERRED EMBODIMENT

Details of Construction

Figure 1:
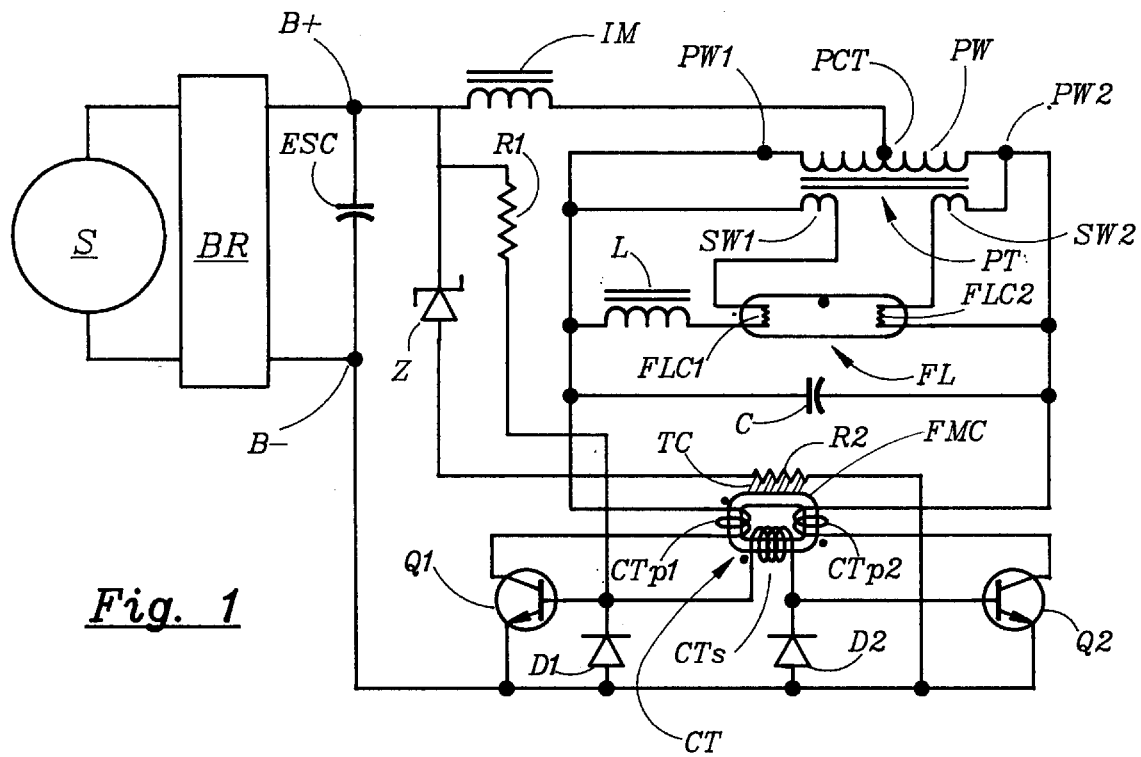
FIG. 1 provides a schematic circuit diagram of the preferred embodiment of the invention.

FIG. 1 shows an AC voltage source S, which in reality is an ordinary 120 Volt/60 Hz electric utility power line. Connected directly across S is a bridge rectifier BR, the DC output from which is applied to a B+ terminal and a B− terminal—with the B+ terminal being of positive polarity in respect to the B− terminal. Connected directly between the B+ and B− terminals is an energy-storing capacitor ESC.

Connected between the B+ terminal and a center-tap PCT of the primary winding PW of a power transformer PT is an inductor means IM. Primary winding PW has two terminals PW1 and PW2 in addition to its center-tap PCT. Across terminals PW1 and PW2 is connected a capacitor C, as well as a series-combination of a fluorescent lamp FL and an inductor L.

Power transformer PT has two secondary windings SW1 and SW2 connected respectively with cathodes FLC1 and FLC2 of fluorescent lamp FL.

The collector of a first transistor Q1 is connected to terminal PW1 by way of a first primary winding CTp1 of a saturable feedback current transformer CT; and the collector of a second transistor Q2 is connected to terminal PW2 by way of a second primary winding CTp2 of current transformer CT.

Secondary winding CTs of current transformer CT is connected directly between the bases of transistors Q1 and Q2. Current transformer CT has a ferrite magnetic core FMC.

A diode D1 is connected between the base and the emitter of transistor Q1, with the diode's cathode being connected to the base. Similarly, a diode D2 is connected between the base and the emitter of transistor Q2, with the diode's cathode being connected with the base. The emitters of transistors Q1 and Q2 are both connected with the B− terminal. Connected between the B+ terminal and the base of transistor Q1 is a resistor R1.

A Zener diode Z is connected with its cathode to the B+ terminal and with its anode to one terminal of a resistor R2. The other terminal of resistor R2 is connected with the B− terminal.

Resistor R2 is placed in close proximity with the ferrite magnetic core FMC of current transformer CT; and a thermal conduction means TC is placed between resistor R2 and this ferrite magnetic core FMC.

Details of Operation

In FIG. 1, the 120 Volt/60 Hz power line voltage is rectified by rectifier BR and, due to the filtering effect of capacitor ESC, provides a DC voltage of substantially constant magnitude between the B+ and the B− terminals. At low line voltage, the magnitude of this DC voltage is about 144 Volt; at normal line voltage it is 160 Volt; at high line voltage, it is 176 Volt.

The Zenering voltage of Zener diode Z is about 144 Volt; which implies that substantially no current flows through resistor R2 at low line voltage. At high line voltage, on the other hand, current-flow through the Zener diode is only limited by the resistance of resistor R2, which at this point sees a voltage of about 32 Volt magnitude. The value of resistor R2 is chosen such as to provide a certain amount of heating of the ferrite magnetic core of current transformer CT.

The purpose of providing heat to the ferrite magnetic core is that of controlling the oscillating frequency of the inverter, which oscillating frequency is principally determined by the saturation time associated with the saturable feedback current transformer CT. This saturation time is principally determined by the saturation magnetic flux density of the ferrite magnetic core FMC; and the saturation flux density, in turn, is a function of the temperature of the ferrite magnetic core: the higher the core temperature, the lower the magnitude of the saturation flux density.

Otherwise, the operation of the inverter circuit itself, which consists of inductor means IM, power transformer PT, saturable feedback current transformer CT, transistors Q1 and Q2, diodes D1 and D2, and biasing resistor R1, may be understood as a very special combination of the basic inverter circuits described in U.S. Pat. No. 4,277,726 to Burke and in U.S. Pat. No. 4,279,011 to Nilssen. By combining features of these two types of inverter circuits, useful effects may be obtained.

In the basic inverter circuit described by Burke, inverter oscillating frequency is determined by the inductance of power transformer PT as naturally interacting with the net capacitive reactance parallel-connected therewith (i.e., predominantly C).

On the other hand, in the basic inverter circuit described by Nilssen, inverter oscillating frequency is determined by the saturation time of the saturable feedback current transformer.

Thus, in the circuit of FIG. 1, inverter oscillating frequency is principally determined by the saturation time of saturable feedback current transformer PCT. However, for this to be the case, it is necessary that this saturation time be longer than the half-period of the natural resonance frequency associated with the inductance of the power transformer as interacting with the net capacitive reactance represented by capacitor C and the effect of the load circuit (which consists of inductor L in series-connection with the fluorescent lamp).

Figure 2:
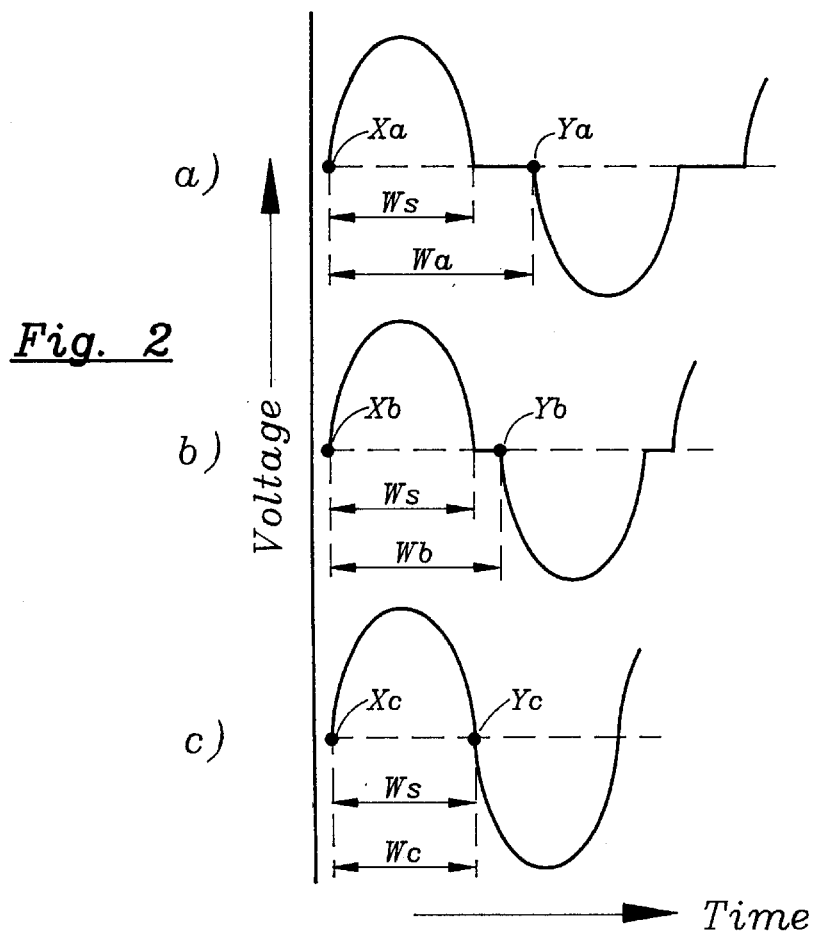
FIG. 2 provides illustration of various voltage waveforms associated with the embodiment of FIG. 1.
Figure 1:
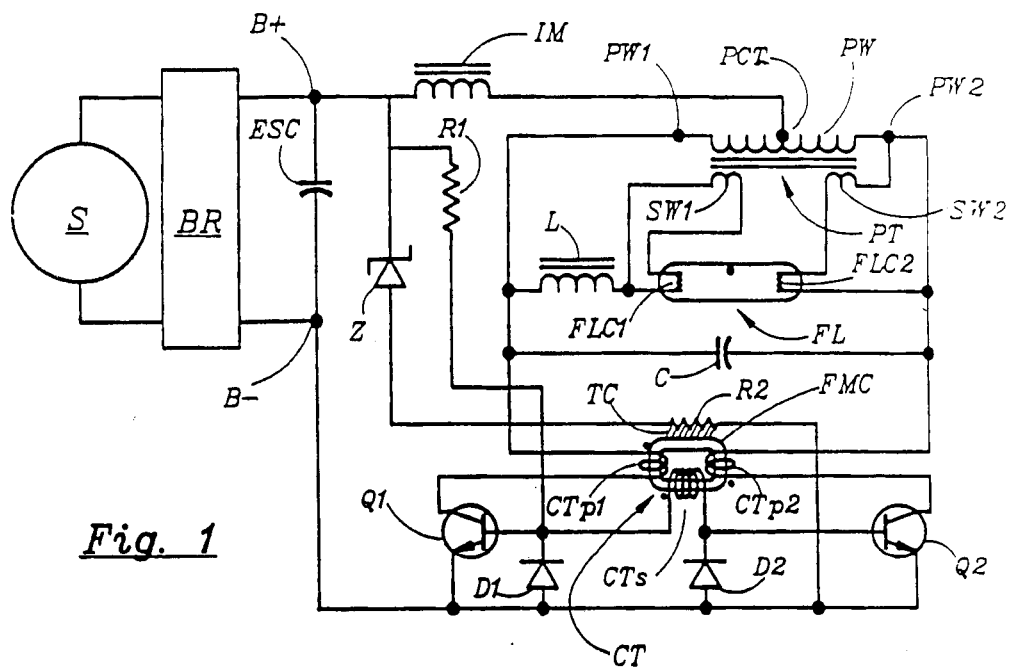
Figure 2:
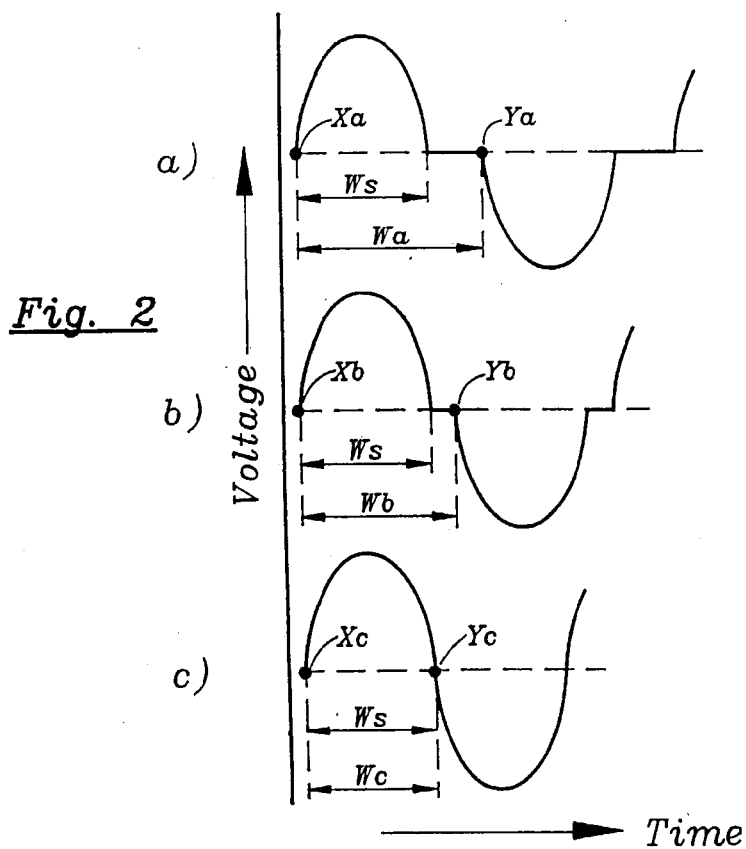

By way of various voltage waveforms, FIG. 2 effectively illustrates the operation of the inverter circuit of FIG. 1.

FIG. 2a shows the intermittently sinusoidal waveform of the voltage present across power transformer PT as observed between its center-tap PCT and terminal PW1 for the situation of low line voltage; in which situation the magnitude of the DC supply voltage is 144 Volt. Thus, in this situation, the average magnitude of the voltage existing during a complete half-cycle (i.e., between points Xa and Ya in FIG. 2a) must by basic necessity be 144 Volt.

By choice of saturation time of current transformer CT, and with no heating provided by resistor R2, the width Wa of this complete half-cycle is made to be about 22% wider than the width Ws of the base of the sinusoidal half-cycle existing between points Xa and Ya. As a necessary consequence of this fact, the amplitude of the sinusoidal half-cycle per se must be about 22% larger than would have been the case if the width Ws of this sinusoidal half-cycle had been equal to that of the complete inverter half-cycle Wa—the reason being that the average magnitude of the complete inverter half cycle must in this case by basic necessity be equal to 144 Volt.

In FIG. 2a, it is noted that the sinusoidal half-cycle located between points Xa and Ya is a half-cycle of the natural resonance action between the inductance of power transformer PT and the combination of capacitor C and the load circuit consisting of inductor L connected in series with the fluorescent lamp FL. Thus, the degree that the distance between points Xa and Ya is longer than the base of the sinusoidal half-cycle corresponds to the degree that the inverter's oscillating frequency is lower than the natural resonance frequency of the inductance of power transformer PT as interacting with the combination of capacitor C and the load circuit.

FIG. 2b shows the corresponding voltage waveforms existing under the condition of normal line voltage, in which case the magnitude of the DC supply voltage is 160 Volt. In this case, due to heating by resistor R2 of the ferrite magnetic core of transformer CT, the saturation time of this saturable transformer has been shortened to the point where the width Wb of the complete inverter half-cycle is only about 11% wider than the width Ws of the sinusoidal half-cycle. In this case, the average magnitude of the voltage existing between points Xb and Yb must by necessity be equal to 160 Volt; which implies that the magnitude of the sinusoidal half-cycle per se must be about 11% larger than it would have been if Ws had been equal to Wb.

FIG. 2c shows the corresponding voltage waveforms existing under the condition of maximum line voltage, in which case the magnitude of the DC supply voltage is 176 Volt. In this case, due to further heating by resistor R2 of the ferrite magnetic core of transformer CT, the saturation time has been been shortened to the point where the width of Wc of the complete inverter half-cycle is about equal to the width Ws of the sinusoidal half-cycle. In this case, the average magnitude of the voltage existing between points Xc and Yc must by basic necessity be equal to 176 Volt. Also, at this point, the inverter oscillating frequency equals the natural resonance frequency of the inductance of power transformer PT as interacting with the combination of capacitor C and the load circuit.

Comparing FIGS. 2a, 2b and 2c, it is seen that the magnitude of the sinusoidal half-cycles remains roughly constant even though the magnitude of the DC supply voltage varies over a range of +/−10%. The inverter frequency, on the other hand, changed substantially in inverse proportion to the magnitude of the DC supply voltage. With an inductor as the lamp current-limiting means, the overall implication is such that the power provided to the lamp remains substantially constant as the magnitude of the DC supply voltage changes by +/−10%.

The degree of controlling effect achieved depends on the degree of heating provided by resistor R2 to the magnetic ferrite core of transformer CT: the lower the resistance of R2, the better the thermal coupling between R2 and the magnetic ferrite core MFC, the smaller the physical size of transformer CT, the lower the heat losses from MFC, etc., the larger the degree of control. It is readily possible to provide for a change in the saturation time of some +/−20% as a result of the +/−10% change in the magnitude of the DC supply voltage, in which case the result would be over-regulation.

It is readily possible to provide for an additional and/or separate means for controlling the amount of heating provided to the ferrite core. For instance, a variable resistor means could be used to provide a selectable initial temperature bias; which, inter alia, could be used for control of light output irrespective of the magnitude of the DC supply voltage.

Or, the input from a light control means, such as a photo-cell, could be used for automatically affecting the core temperature and thereby to correspondingly control the amount of light provided by the lamp.

If, instead of an inductor, a capacitor were to be used as a lamp current-limiting means, it would still be possible to achieve light output regulation by way of controlling the saturation flux limits of the magnetic ferrite core of the saturable feedback transformer. However, in this case it would be necessary to heat the magnetic ferrite material in inverse relationship with the magnitude of the DC supply voltage.

By making R2 non-linear (such as, for instance, combining it with a Zener diode and/or a thermistor), it is possible to provide an improved regulation profile, thereby attaining more accurate regulation of light output as function of line voltage magnitude variations.

The voltage waveforms illustrated by FIG. 2, such as the one shown by FIG. 2a, correspond to the voltage provided to the series-combination of inductor L and fluorescent lamp FL. These waveforms may be described as sinusoidal half-cycles interconnected with periods of substantially zero voltage.

Also, by selectively modifying the functional relationship between the magnitude of the DC supply voltage and the amount of heat provided to the ferrite magnetic core, it is possible to arrange for the net inverter output voltage (as illustrated by FIG. 2) to behave in a wide variety of different ways: it would readily be possible to make the RMS magnitude remain constant as the magnitude of the DC supply voltage changes; or, to have the power provided to the load circuit (i.e., to the lamp) remain constant as the magnitude of the DC supply voltage changes; or, to have the magnitude of the fundamental frequency-component of the waveforms in FIG. 2 decrease in direct proportion with the basic repetition frequency of the waveforms (i.e., the basic inversion frequency); or, conversely, to make this repetition frequency decrease in direct proportion to the magnitude of this fundamental frequency component; etc.

In respect to the effect of temperature on the magnitude of the magnetic saturation flux of ferrite magnetic cores, reference is made to various handbooks and product catalogs relating to magnetic ferrites for inverter applications.

It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

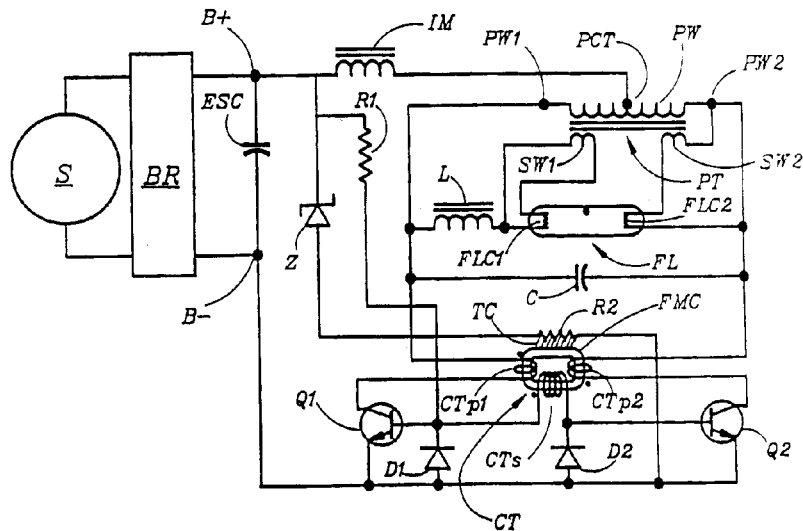

What is claimed is:

1. An arrangement comprising:
    an ordinary electric utility AC power line operable to provide an AC power line voltage at a pair of AC power line terminals;
    a voltage conditioning circuit having a set of AC input terminals drawing an AC input current and being operative to provide a DC supply voltage at a pair of DC supply terminals; the magnitude of the DC supply voltage being substantially constant;
    an inverter circuit having a pair of DC input terminals and a pair of AC output terminals; the inverter circuit being characterized in that its pair of DC input terminals draws a DC current and its AC output terminals supplies an AC output voltage; the AC output voltage being of a frequency substantially higher than that of the AC power line voltage and having a waveform consisting of sinusoidally-shaped half-cycles of voltage of alternating polarity; the waveform having a repetition period and being substantially sinusoidal except for a distinct discontinuity occurring over a brief period during each repetition period at or near each point-in-time where the instantaneous magnitude of the AC output voltage changes polarity; said brief period being substantially shorter than half of the duration of one of said half-cycles; the inverter circuit being further characterized by including two periodically conducting transistors, one of which is always conducting;
    a gas discharge lamp;
    the equivalent of an inductive impedance; and
    the equivalent of a reactive impedance;
    the arrangement being inter-connected such that:
        (1) the AC input terminals are connected with the AC power line terminals;
        (2) the DC input terminals are connected with the DC output terminals by way of said equivalent of an inductive impedance; and
        (3) the lamp and said equivalent of a reactive impedance are series-connected across the AC output terminals.

2. The arrangement of claim 1 further characterized in that the magnitude of the AC output voltage is distinctly lower during said brief period, as averaged over said brief period, than it would have been had said waveform been smoothly sinusoidal.

3. The arrangement of claim 1 wherein the instantaneous magnitude of the AC output voltage is at or near zero during said brief part.

4. The arrangement of claim 1 wherein the inverter circuit is further characterized by including the equivalent of an inductive reactance parallel-connected with the equivalent of a capacitive reactance, thereby to form a parallel-resonant circuit having a natural resonance frequency distinctly different from that of the AC output voltage.

5. The arrangement of claim 1 further characterized by having the equivalent of a control circuit operative to control the duration of said brief part.

6. The arrangement of claim 1 further characterized by not including a capacitor series-connected with an inductor so as to form a near resonant circuit.

7. An arrangement comprising:
    an ordinary electric utility AC power line operable to provide an AC power line voltage at a pair of AC power line terminals;
    a voltage conditioning circuit having a set of AC input terminals drawing an AC input current and being operative to provide a DC supply voltage at a pair of DC supply terminals; the magnitude of the DC voltage being substantially constant;
    an inverter circuit having a pair of DC input terminals and a pair of AC output terminals; the inverter circuit being characterized in that its pair of DC input terminals draws a DC current and its AC output terminals supplies an AC output voltage; the AC output voltage having a waveform and being of a frequency substantially higher than that of the AC power line voltage; the waveform having a repetition period and being substantially sinusoidal except for a distinct discontinuity occurring over a brief period during each repetition period at or near each point-in-time where the instantaneous magnitude of the AC output voltage changes polarity; said brief period being substantially shorter than one quarter of said repetition period; the inverter circuit being further characterized by including two periodically conducting transistors, neither one of which is non-conducting at the same time;

a gas discharge lamp having a pair of lamp terminals;

the equivalent of an inductive impedance having inductor terminals; and the equivalent of a reactive impedance having reactor terminals;

the arrangement being structured such that:
(1) the AC input terminals are connected with the AC power line terminals,
(2) the DC input terminals are connected with the DC output terminals by way of the inductor terminals; and
(3) the lamp terminals are connected with the AC output terminals by way of the reactor terminals.

8. The arrangement of claim 7 further characterized by not including a capacitor series-connected with an inductor so as to form a resonant circuit that is naturally resonant near said frequency.

9. The arrangement of claim 7 wherein the arrangement is still further characterized by not having a capacitor parallel-connected with the fluorescent lamp.

10. An arrangement comprising:

an inverter-type power supply having a pair of AC input terminals connected to an ordinary AC power line voltage and a pair of AC output terminals at which is provided an AC output current of frequency much higher than that of the AC power line voltage; the power supply being further characterized by including: (i) a first inductor parallel-connected with a first capacitor so as to form a parallel-resonant circuit with a natural resonance frequency higher than the frequency of the AC output current; (ii) two alternatingly conducting transistors arranged so that at least one of the two transistors is always conducting; and (iii) a control sub-circuit operative to maintain the magnitude of the AC output current at an approximately constant level irrespective of variations in the magnitude of the AC power line voltage by as much as plus-minus ten percent; the power supply being further characterized by not including a second inductor and a second capacitor series-connected so as to form a near resonant circuit; the control sub-circuit being further characterized by not including the equivalent of two transistors arranged in a Darlington circuit; and a gas discharge lamp connected with the AC output terminals so as to receive said AC output current.

11. The arrangement of claim 10 wherein the two alternatingly conducting transistors periodically exhibit simultaneous conduction.

12. The arrangement of claim 10 further characterized by including a pair of terminals across which exists a DC voltage of substantially constant magnitude higher than 140 Volt.

13. An arrangement comprising:

an ordinary electric utility AC power line operable to provide an AC power line voltage at a pair of AC power line terminals;

an inverter-type power supply having a pair of AC input terminals and a pair of AC output terminals; the AC input terminals being connected with the AC power line terminals; the power supply being characterized by: (i) being operative to provide an AC output voltage across the AC output terminals; (ii) including a first inductor parallel-connected with a first capacitor so as to form a parallel-resonant circuit with a natural resonance frequency distinctly different from the frequency of the AC output voltage; and (iii) by not including a capacitor series-connected with an inductor so at to form a resonant circuit; the AC output voltage being of a frequency substantially higher than that of the AC power line voltage and having a waveform consisting of sinusoidally-shaped half-cycles of voltage of alternating polarity; the waveform having a repetition period equal to that of the AC output voltage and being sinusoidal except for a distinct discontinuity occurring over a brief period during each repetition period at or near each point-in-time where the instantaneous magnitude of the AC output voltage changes polarity; said brief period being shorter than half the duration of one of said half-cycles; the power supply being further characterized by including two periodically conducting transistors, at least one of which is conducting at any given time; and a gas discharge lamp connected with the AC output terminals through the equivalent of a reaction impedance, thereby to draw a manifestly magnitude-limited current from the AC output terminals.

14. The arrangement of claim 13 further characterized in that the two transistors conduct simultaneously for a short time at least once during each repetition period.

15. The arrangement of claim 13 wherein the absolute magnitude of the AC output voltage at or near zero during said brief period.

16. An arrangement comprising:

a voltage conditioning circuit connected with an ordinary AC power line voltage and operative to provide a DC supply voltage at a pair of DC supply terminals; the voltage conditioning circuit being operative to supply a substantially constant-magnitude voltage at a pair of DC supply terminals;

an inverter circuit connected with the DC supply terminals by way of an inductive reactor means and operative to supply an AC output voltage at a pair of AC output terminals; the AC output voltage being of a frequency substantially higher than that of the AC power line voltage and having a waveform consisting of sinusoidally-shaped half-cycles of voltage of alternating polarity; the waveform having a repetition period and being substantially sinusoidal except for a distinct discontinuity occurring over a short time-period during each repetition period at or near each point-in-time where the magnitude of the AC output voltage changes polarity; said short time-period having a duration substantially shorter than half of that of one of said half-cycles; the inverter circuit being further characterized by including two periodically conducting transistors, at least one of which is conducting at any given time;

the equivalent of a reactive current-limiting means having two reactor terminals;

a gas discharge lamp having two lamp terminals; one of the lamp terminals being effectively connected directly with one of the AC output terminals; the other one of the lamp terminals being connected with the other AC output terminal through said equivalent of a reactive impedance means.

17. The arrangement of claim 16 further characterized in that the magnitude of the AC output voltage is distinctly lower during said short time-period, as averaged over said short time-period, than it would have been had said waveform been smoothly sinusoidal.

18. The arrangement of claim 17 wherein the instantaneous magnitude of the AC output voltage is at or near zero during said brief time-period.

19. The arrangement of claim 16 wherein the waveform of the AC output voltage is substantially sinusoidal except for a brief time-span during which the absolute magnitude of the slope of the waveform is distinctly lower than it would have been at said point-in-time if the waveform had indeed been smoothly sinusoidal.

20. An arrangement comprising:
a voltage conditioning circuit connected with ordinary AC power line voltage and operative to provide a DC supply voltage at a pair of DC supply terminals; the magnitude of the DC voltage being substantially constant;
an inverter circuit being connected with the DC supply terminals and having a pair of AC output terminals at which is provided an AC output voltage; the AC output voltage having a waveform and being of a frequency substantially higher than that of the AC power line voltage; the waveform having a repetition period and being substantially sinusoidal except for a distinct discontinuity occurring during each repetition period at or near each point-in-time where the instantaneous magnitude of the AC output voltage changes polarity and occupying a time-span that is substantially shorter than one quarter of said repetition period; the inverter circuit being further characterized by including two periodically conducting transistors, at least one of which is conducting at any given time;
a current-limiting reactive impedance having a pair of reactor terminals;
a gas discharge lamp having a pair of lamp terminals; one of the lamp terminals being connected directly with one of the AC output terminals; the other one of the lamp terminals being connected with the other one of the AC output terminals through said reactive impedance;
the arrangement being further characterized by: (i) not including a high frequency leakage transformer; and (ii) not including an inductor series-connected with a lamp-capacitor parallel-combination.

21. An arrangement comprising:
a voltage conditioning circuit connected with ordinary AC power line voltage and operative to provide a DC supply voltage at a pair of DC supply terminals; the magnitude of the DC voltage being substantially constant;
an inverter circuit being connected with the DC supply terminals and having a pair of AC output terminals at which is provided an AC output voltage; the AC output voltage having a waveform consisting of sinusoidally-shaped half-cycles of voltage of alternating polarity, such that the waveform is intermittently sinusoidal in that each half-cycle is separated by a brief time-period during which the waveform temporarily but distinctly deviates from its otherwise sinusoidal nature; the waveform having a repetition period; the brief time-period being substantially shorter than one quarter of the repetition period; the inverter circuit being further characterized by including two periodically conducting transistors, at least one of which is conducting at any given time;
a current-limiting reactive impedance having a pair of reactor terminals;
a gas discharge lamp having a pair of lamp terminals; one of the lamp terminals being connected directly with one of the AC output terminals; the other one of the lamp terminals being connected with the other one of the AC output terminals through said reactive impedance.

22. An arrangement comprising:
an inverter circuit powered from a source of DC voltage of substantially constant magnitude and operative to provide an AC output voltage at a pair of AC output terminals; the AC output voltage having a waveform consisting of sinusoidally-shaped half-cycles of voltage of alternating polarity; the waveform being intermittently sinusoidal in that each sinusoidally-shaped half-cycle is separated by a brief time-period during which the waveform temporarily but distinctly deviates from its otherwise sinusoidal nature; the waveform having a repetition period; the brief time-period being shorter than one quarter of the repetition period; the inverter circuit being further characterized by including two periodically conducting transistors, at least one of which is conducting at any given time; the transistors each having a base-emitter junction; the base-emitter junctions jointly receiving a unidirectional bias current of substantially constant magnitude;
a current-limiting reactive impedance;
a gas discharge lamp;
the lamp and the current-limiting reactive impedance being series-connected across the AC output terminals.

23. The arrangement of claim 22 wherein the inverter circuit is further characterized by including a capacitor parallel-connected with an inductor so as to form a parallel-resonant circuit having a natural resonance frequency that is distinctly different from the frequency of the AC output voltage.

24. The arrangement of claim 22 further characterized by not including: (i) an inductor series-connected with a parallel-combination of a capacitor and a gas discharge lamp; and (ii) a leakage reactance transformer.

25. An arrangement comprising:
an inverter circuit powered from a source of constant-magnitude DC voltage and operative to provide an AC voltage at a pair of AC terminals; the AC voltage being of a frequency substantially higher than that of ordinary AC power line voltage and having a waveform consisting of sinusoidally-shaped half-cycles of voltage of alternating polarity; the waveform having a repetition period and being substantially sinusoidal except for a distinct discontinuity occurring during a brief time-span at least once during each repetition period at or near a point-in-time where the instantaneous magnitude of the AC output voltage changes polarity; said brief time-span being substantially shorter than half of the duration of one of said half-cycles; the inverter circuit being further characterized by including two periodically conducting transistors, one of which is always conducting; each transistor having a base-emitter junction; the two base-emitter junctions jointly receiving a forward bias current of substantially constant magnitude;
a current-limiting reactive impedance;
a gas discharge lamp;
the lamp and the current-limiting reactive impedance being series-connected across the AC output terminals.

26. The arrangement of claim 25 including a parallel-connected L-C circuit having a natural resonance frequency distinctly different from the frequency of the AC voltage.

* * * * *

UNITED STATES PATENT AND TRADEMARK OFFICE
CERTIFICATE OF CORRECTION

PATENT NO.    : 6,472,827 B1
DATED         : October 29, 2002
INVENTOR(S)   : Ole K. Nilssen It is certified that error appears in the above-identified patent and that said Letters Patent is hereby corrected as shown below:

Delete the title page and substitute therefore attached title page.
Delete Drawing Sheet 1 and substitute therefore attached Drawing Sheet 1.

Signed and Sealed this

Twenty-second Day of July, 2003

JAMES E. ROGAN
*Director of the United States Patent and Trademark Office*

(12) United States Patent
Nilssen

(10) Patent No.: US 6,472,827 B1
(45) Date of Patent: *Oct. 29, 2002

(54) PARALLEL-RESONANT INVERTER-TYPE FLUORESCENT LAMP BALLAST

(76) Inventor: Ole K. Nilssen, 602 Caesar Dr., Rte. 5, Barrington, IL (US) 60010

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/032,569

(22) Filed: Mar. 18, 1993

Related U.S. Application Data

(63) Continuation of application No. 07/719,671, filed on Jun. 24, 1991, now abandoned, which is a continuation of application No. 07/346,292, filed on May 1, 1989, now abandoned, which is a continuation of application No. 06/697,949, filed on Feb. 4, 1985, now abandoned, which is a continuation-in-part of application No. 06/658,423, filed on Oct. 5, 1984, now abandoned.

(51) Int. Cl.[7] .................................................. H05B 37/01
(52) U.S. Cl. ................... 315/209 R; 315/219; 315/222; 315/224; 315/279; 315/307; 315/DIG. 7; 363/19; 363/23; 363/133; 323/249; 323/302
(58) Field of Search ........................ 315/209 R, 219, 315/222, 224, 279, 307, DIG. 7; 363/19, 23, 133; 323/249, 302

(56) References Cited

U.S. PATENT DOCUMENTS

| | | | | | |
|---|---|---|---|---|---|
| 4,277,726 A | * | 7/1981 | Burke | ................... | 315/224 X |
| 4,484,108 A | * | 11/1984 | Stupp et al. | ................. | 315/219 |
| 4,513,364 A | * | 4/1985 | Nilssen | ...................... | 315/219 |
| 4,563,616 A | * | 1/1986 | Stevens | .................. | 315/219 X |

FOREIGN PATENT DOCUMENTS

| EP | 0126556 A | * 11/1984 | .................. 315/219 |
|---|---|---|---|

* cited by examiner

*Primary Examiner*—Michael B Shingleton

(57) ABSTRACT

A push-pull inverter is supplied from an inductively current-limited DC voltage source by way of a center-tap on a transformer having significant inductance. This transformer inductance is parallel-coupled with a capacitance means. The inverter is made to self-oscillate through positive feedback provided by way of a saturable current transformer. The inverter frequency is determined by the saturation time of this current transformer, which saturation time is designed to be somewhat longer than the half-cycle period of the natural resonance frequency of the transformer inductance combined with the capacitance means. By controlling the length of this saturation time, the magnitude of the current provided to the fluorescent lamp is controlled, thereby permitting control of the light output in response to changes in the magnitude of the power line voltage.

26 Claims, 1 Drawing Sheet